United States Patent
Tanaka

[11] Patent Number: 5,703,415
[45] Date of Patent: Dec. 30, 1997

[54] POWER SUPPLY CIRCUIT

[75] Inventor: Toshimasa Tanaka, Kyoto, Japan

[73] Assignee: Rohm Co., Ltd., Kyoto, Japan

[21] Appl. No.: 633,948

[22] Filed: Apr. 17, 1996

[30] Foreign Application Priority Data

Apr. 18, 1995  [JP]  Japan ............................ 7-091218

[51] Int. Cl.⁶ .................................................. H02J 9/06
[52] U.S. Cl. .................. 307/66; 307/66; 307/80; 307/83; 307/97; 320/2; 323/265; 323/271
[58] Field of Search ..................... 307/66, 64, 43, 307/80, 85, 86, 87; 320/2; 323/265, 271

[56] References Cited

U.S. PATENT DOCUMENTS

| | | | |
|---|---|---|---|
| 4,323,788 | 4/1982 | Smith | 307/66 |
| 4,427,899 | 1/1984 | Bruns | 307/66 |
| 4,617,473 | 10/1986 | Bingham | 307/66 |
| 4,785,226 | 11/1988 | Fujisawa et al. | 320/21 |
| 4,788,450 | 11/1988 | Wagner | 307/64 |

*Primary Examiner*—Brian Sircus
*Assistant Examiner*—Albert W. Paladini
*Attorney, Agent, or Firm*—Nikaido Marmelstein Murray & Oram LLP

[57] ABSTRACT

A power supply circuit is provided with a first battery, a second battery, an output terminal, and a voltage dividing circuit for dividing a voltage from the first battery. An output voltage of the dividing circuit is compared with a voltage of the second power source by a comparing circuit. A first P-channel-type MOSFET is connected between the first battery and the output terminal. A second P-channel-type MOSFET is connected between the second battery and the output terminal. Depending on an output from the comparing circuit, one of the MOSFET is turned on, and the other is turned off.

8 Claims, 3 Drawing Sheets

POWER SUPPLY CIRCUIT

BACKGROUND OF THE INVENTION

1. Field of the Invention

The present invention relates to a power supply circuit that is used, for example, to back up a RAM (Random Access Memory).

2. Description of the Prior Art

Conventionally, a power supply circuit, such as is used to back up a RAM, has been constructed as shown in FIG. 1. FIG. 1 is a circuit diagram showing a conventional power supply circuit, where reference numeral 1 represents a first power source comprising a battery, reference numeral 2 represents a second power source comprising a battery, and reference numerals 20 and 21 represent diodes. The working of a conventional power supply circuit thus constructed will be described below.

Assume the voltage of the first power source is V1, and that of the second power source is V2. When V1>V2, the diode 21 is brought into a cutoff state, and a voltage V1−VD1 is supplied to the output terminal, where VD1 represents a forward voltage drop of the diode 20.

Next, suppose the voltage of the first power source V1 drops. When V1<V2, the diode 20 is brought into a cutoff state and a voltage V2−VD2 is supplied to the output terminal, where VD2 represents the forward voltage drop of the diode 21.

Thus, the output terminal 23 is supplied with a voltage of either the first or the second power source minus the forward voltage drop of the diode 20 or 21, respectively. The voltage at the output terminal, though it is not shown in the figure, is to be used as a power source for the whole system.

However, a conventional power supply circuit as described above is defective in that both the first and the second power sources serve to supply power to the same system, that is, to the same load, in that the voltage supplied to the system is reduced because of the forward voltage drop of a diode, and in that the voltage available from a power source is reduced by the value of VD1 or VD2. A conventional power supply circuit is defective also in that a system must always be designed with such voltage drops being considered. The voltage drop in the diode 20 or 21 is approximately 0.6 V when a 1 mA current is flowing.

SUMMARY OF THE INVENTION

It is an object of the present invention to provide a power supply circuit in which voltage drops are negligibly reduced.

A power supply circuit according to the present invention is provided with a first power source, a second power source, an output terminal, voltage dividing means for dividing a voltage from said first power supply, comparing means for comparing an output voltage from said dividing means with a voltage of said second power source, and selecting means for selecting either said first power source or said second power source depending on an output from said comparing means and for providing a selected voltage to the output terminal. In such a power supply circuit, it is possible to use P-channel-type MOSFETs, which have small voltage drops in the ON state, for the switching on and off of a power source, thus using the voltage of a power source efficiently.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
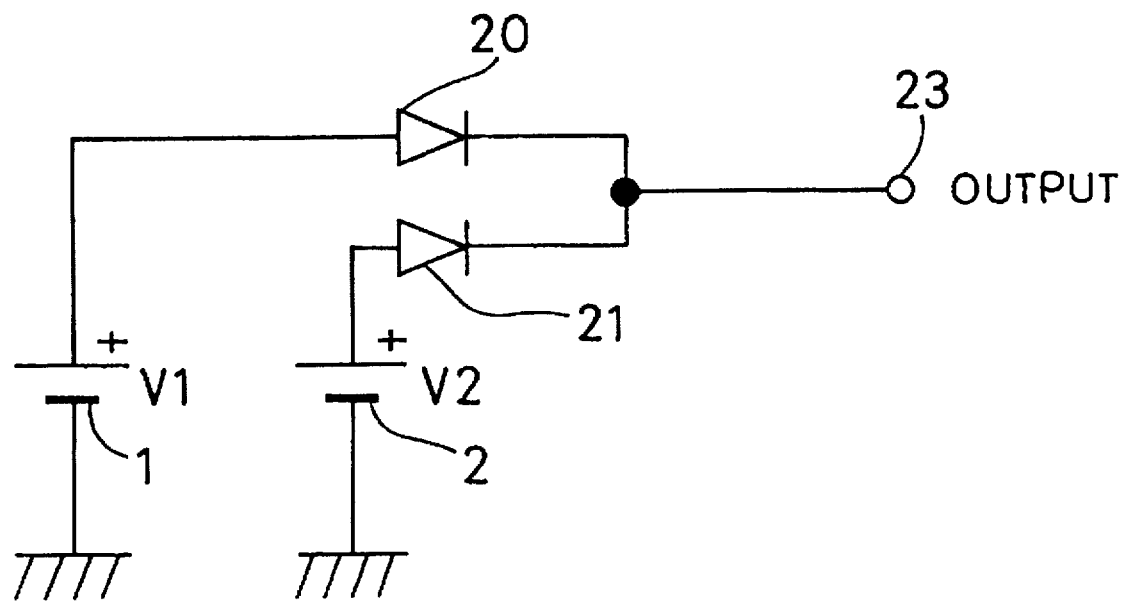
FIG. 1 is a circuit diagram showing a construction of a power supply circuit of a prior art.
Figure 2:
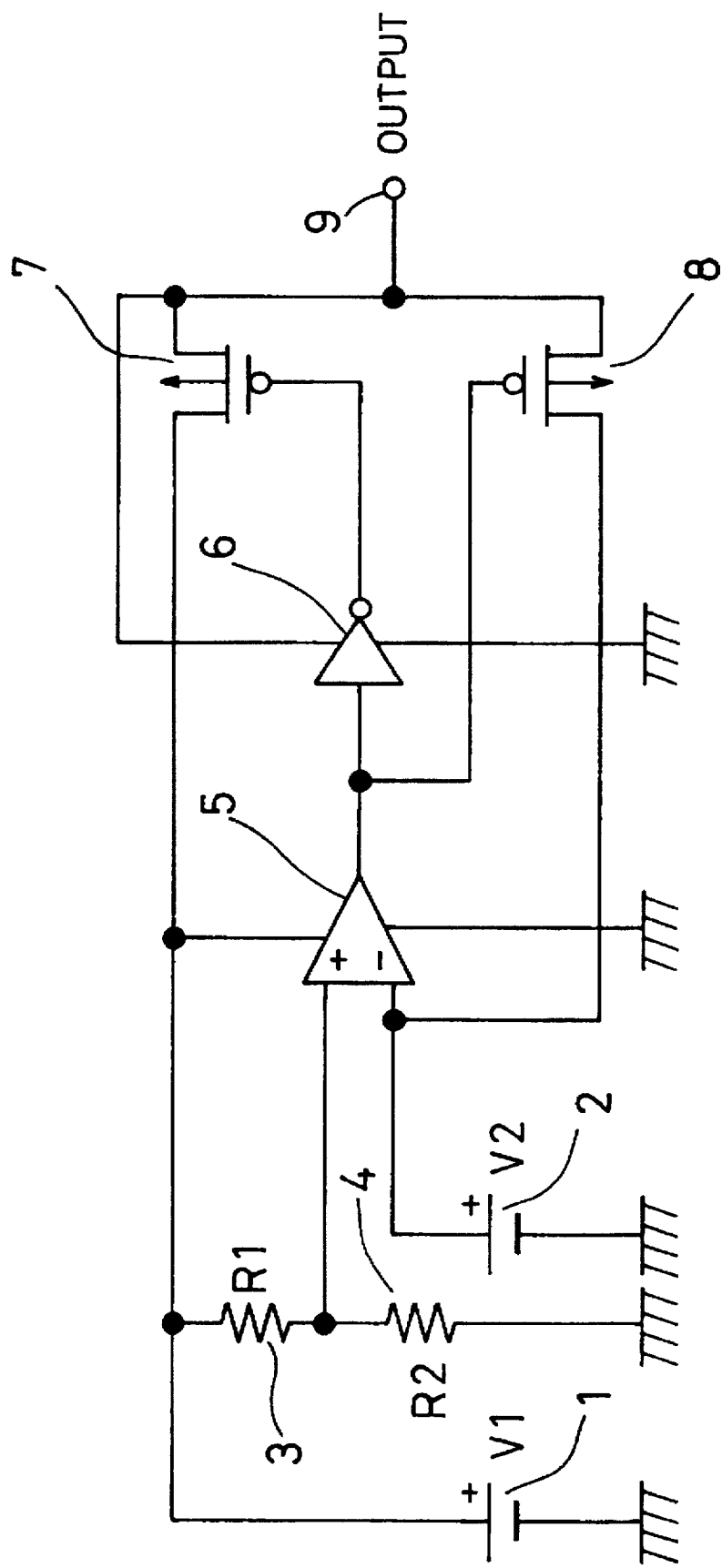
FIG. 2 is a circuit diagram showing a construction of an power supply circuit embodying the present invention.

With reference to the drawings, the construction and working of a power supply circuit according to the present invention will be described below. FIG. 2 is a circuit diagram showing a construction of a power supply circuit embodying the present invention. In the figure, reference numeral 1 represents a first power source for supplying power in normal operation, reference numeral 2 represents a second power source comprising a battery for supplying power in back-up operation, reference numerals 3 and 4 represent resistors composing a voltage dividing circuit, reference numeral 5 represents a comparator, reference numeral 6 represents an inverter, and reference numeral 7 and 8 represent P-channel-type MOSFETs (Metal Oxide Semiconductor Field Effect Transistors).

The working of a power supply circuit constructed as described above according to the present invention will be described below. When $R2/(R1+R2)\cdot V1 > V2$, the comparator 5 turns the output high, causing the inverter 6 to turn the output low. As a result, the MOSFET 8 is turned off while the MOSFET 7 is turned on, causing the voltage of first power source 1 to be delivered to the output terminal. Here, R1 and R2 represent resistances of the resistors 3 and 4, respectively.

Assume now the voltage of the first power source 1 drops, causing the voltage $R2/(R1+R2)\cdot V1$ at the noninverting terminal (+) of the comparator 5 to become lower than the voltage V2 at the inverting terminal (−) of the comparator. The comparator 5 then turns the output low.

As a result, the inverter 6 turns the output high, causing the MOSFET 7 to be turned off. On the other hand, the MOSFET 8 is turned on, causing the voltage V2 of the second power source to be delivered to the output terminal 9. In this sequence of operation, the MOSFETs 7 and 8, while being on, offer no more resistance than the resistance in the ON state and, consequently, they cause substantially no voltage drop, unless an extraordinarily large amount of current is fed. For example, when a current of 1 µA is flowing, the voltage drop is approximately 0.1 V and it can further be reduced by forming a larger transistor.

In addition, if resistors 3 and 4 are integrated in an IC, sufficient accuracy can be secured with respect to the voltage division ratio $R2/(R1+R2)$. Therefore, only V1 and V2 are to be considered as factors that may cause fluctuation.

Figure 3:
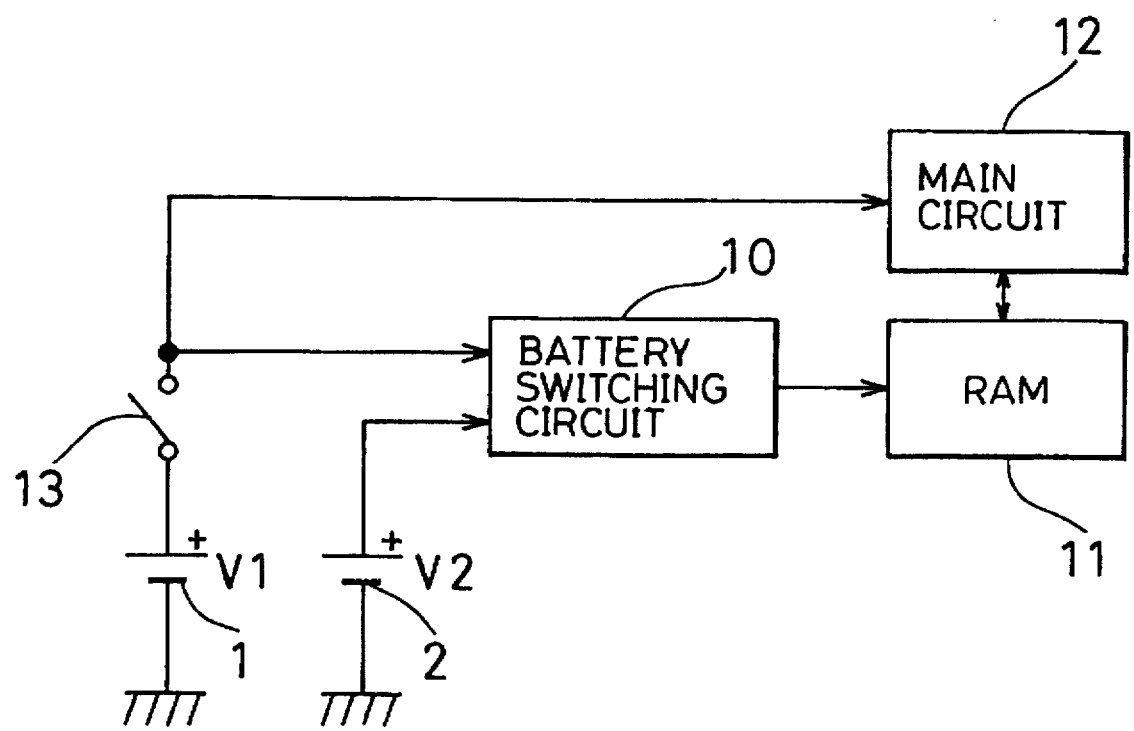
FIG. 3 is a block diagram showing a construction of another power supply circuit embodying the present invention.

FIG. 3 illustrates an example of a system using a circuit as described above. In FIG. 3, reference numeral 10 represents a battery switching circuit, reference numeral 11 represents a RAM, reference numeral 12 represents a main circuit having a microcomputer, and reference numeral 13 represents a system power switch. Here, the battery switching circuit 10 comprises, just as shown in FIG. 2, resistors 3 and 4, a comparator 5, an inverter 6 and MOSFETs 7 and 8, and operates as a whole just in the same manner as is described above.

In normal operation, when the switch 13 is closed, the voltage V1 of the first power source 1 actuates the main circuit 12. In this case, the battery switching circuit 10 supplies the voltage V1 of the first power source 1 to the RAM 11, thus enabling the main circuit 12 to exchange data with the RAM 11.

In contrast, when the switch 13 is opened, the main circuit 12 stops operating and the battery switching circuit 10 supplies the voltage V2 of the second power source 2 to the RAM 11 to keep it operating. In this case, the inverter 6 turns the output high, thereby turning the MOSFET 7 off. As a result, the RAM 11 keeps the data therein, that is, the RAM is backed up. Similarly, when the first power source 1 is exhausted to the extent that the expression $$V2 > V1 \cdot \frac{R2}{R1+R2}$$

holds, the RAM 11 will be backed up, even though the main circuit 12 cannot continue operating.

As seen from the above, in an embodiment according to the present invention, only the voltage R2/(R1+R2)·V1 and the voltage V1 have to be considered with regard to the power output of the battery switching circuit, that is, the power source for RAM back-up. The present invention therefore has an advantage of eliminating the need to consider forward voltage drops, owing to the absence of diodes that have conventionally been used.

Further, there is no need to consider voltage drops in diodes and power consumed thereby. The present invention therefore has advantages of fully utilizing the power of back-up batteries (second power source 2) without wasting it, and of reducing designing time thanks to reduced number of parameters to be considered in designing.

In the above embodiment, it is not appropriate to use N-channel-type MOSFETs instead of the P-channel-type MOSFETs 7 and 8 by replacing the inverter 6 with a buffer circuit, because, in an N-channel-type MOSFET, the Gate voltage is required to be equal to or higher than the source voltage in order to turn the MOSFET on. Accordingly, if an N-channel-type MOSFET is used instead of the MOSFETs 7 and 8 in FIG. 2, the voltage at the output terminal 9 will be lower than an output voltage that would be obtained if a P-channel-type MOSFET is used, because it is impossible to set the Gate control voltage as high as V1 while the MOSFET is on. And this does not conform to the object of using the voltage V1 with substantially no voltage drop. To turn on a P-channel-type MOSFET, in contrast, the gate voltage may be lower than the source voltage. Therefore, use of P-channel MOSFETs conforms to the object of using the source voltage without voltage drops.

What is claimed is:

1. A power supply circuit, comprising:

a first power source;

a second power source;

an output terminal;

voltage dividing means, connected to said first power source, for dividing a voltage of said first power source;

comparing means, connected to said second power source and an output of said voltage dividing means, for comparing the output of said voltage dividing means with said second power source; and selecting means, connected to an output of said comparing means, for selecting either said first power source or said second power source depending on the output of said comparing means and for supplying a selected voltage to the output terminal.

2. A power supply circuit as claimed in claim 1, wherein at least one of said first and second power sources is a battery.

3. A power supply circuit as claimed in claim 1, wherein said selecting means includes a first P-channel-type MOS transistor connected between the first power source and the output terminal and a second P-channel-type MOS transistor connected between the second power source and the output terminal, one of said MOS transistors being turned on and the other being turned off in response to an output from the comparing means.

4. A power supply circuit as claimed in claim 3, wherein at least one of said first and second power sources is a battery.

5. A power supply circuit as claimed in claim 3, wherein either said first MOS transistor or said second MOS transistor is alternatively turned on depending on whether a voltage of said first power source is higher or lower than a voltage of said second power source.

6. A power supply circuit, comprising:

a first power source;

a switch connected between said first power source and a main circuit for turning the power on and off;

a second power source; and a power source switching circuit, having a first input terminal connected to the output of said switch, a second input terminal connected to said second power source, and an output terminal connected to a memory, said power source switching circuit includes a voltage dividing means, connected to said first and second input terminals, for dividing a voltage at said first terminal, wherein said power source switching circuit supplies to the memory alternatively either a voltage at said first input terminal or a voltage at said second input terminal depending on whether a voltage obtained by dividing the voltage at the first input terminal is higher or lower than that at the second input terminal.

7. A power supply circuit as claimed in claim 6, wherein the memory is a RAM.

8. A power supply circuit as claimed in claim 7, wherein the voltage of the first power source is set higher than that of the second power source, and wherein said power source switching circuit includes a first P-channel-type MOS transistor connected between the first power source and the RAM, a second P-channel-type MOS transistor connected between the second power source and the RAM, wherein either the first MOS transistor or the second MOS transistor being turned on depending on whether a voltage obtained by dividing a voltage at said first input terminal is higher or lower than a voltage at the second input terminal.

* * * * *